United States Patent [19]

Miller et al.

[11] Patent Number: 4,611,342
[45] Date of Patent: Sep. 9, 1986

[54] DIGITAL VOICE COMPRESSION HAVING A DIGITALLY CONTROLLED AGC CIRCUIT AND MEANS FOR INCLUDING THE TRUE GAIN IN THE COMPRESSED DATA

[75] Inventors: William J. Miller, N. Miami, Fla.; Ran F. Chiu, Los Altos, Calif.; Richard B. Joerger, Pembroke Pines, Fla.; Frank W. Newdeck, Hatboro, Pa.

[73] Assignee: Racal Data Communications Inc., Miami, Fla.

[21] Appl. No.: 471,139

[22] Filed: Mar. 1, 1983

[51] Int. Cl.[4] ............................................. G10L 5/00
[52] U.S. Cl. ................................... 381/36; 179/170.6; 340/347 AD; 340/347 M; 367/65
[58] Field of Search ....................... 381/29–40, 381/40–53; 179/175.31 E, 170.2, 170.4, 170.6, 170.8, 175.31 E; 340/347 AD, 347 M; 367/65–67; 364/513, 513.5

[56] References Cited

U.S. PATENT DOCUMENTS

| | | | |
|---|---|---|---|
| 3,821,494 | 6/1974 | Besseyre | 179/170.6 |
| 4,016,557 | 4/1977 | Zitelli et al. | 340/347 AD |
| 4,051,332 | 9/1977 | Izumi et al. | 179/170.2 |
| 4,213,097 | 7/1980 | Chiu et al. | 330/51 |
| 4,230,906 | 10/1980 | Davis | 381/41 |

Primary Examiner—Gareth D. Shaw
Assistant Examiner—John J. Salotto
Attorney, Agent, or Firm—Nixon & Vanderhye

[57] ABSTRACT

An apparatus for use in transmitting compressed digital voice data includes an analyzer for compressing digitized voice data according to an algorithm which produces a root mean square of the voice data. An analog to digital converter is used to convert analog voice signals to digital data as an input to the analyzer. An AGC circuit controls to analog voice signal to keep it within predetermined limits for digitization, with the AGC setting being determined by the root mean square of the digitized data. The digitized data includes data representative of the root mean square adjusted by the inverse of the change induced by the AGC. A speech synthesizer expands the digitized data at a remote location to convert it back to analog speech signals.

20 Claims, 9 Drawing Figures

DIGITAL VOICE COMPRESSION HAVING A DIGITALLY CONTROLLED AGC CIRCUIT AND MEANS FOR INCLUDING THE TRUE GAIN IN THE COMPRESSED DATA

CROSS-REFERENCE TO RELATED APPLICATIONS

This application is related to application No. 471,038, filed Mar. 1, 1983, for DIGITAL VOICE COMPRESSION HAVING A DIGITALLY CONTROLLED AGC CIRCUIT AND MEANS FOR INCLUDING THE TRUE GAIN IN THE COMPRESSED DATA; application No. 471,137, filed Mar. 1, 1985, for DIGITAL VOICE TRANSMISSION HAVING IMPROVED ECHO SUPPRESSION; and application No. 471,138, filed Mar. 1, 1983, for DIGITAL VOICE TRANSMISSION HAVING IMPROVED ECHO SUPPRESSION.

BACKGROUND

1. Field of the Invention

The present invention relates to digital voice transmission over telephone lines in which a digitized voice signal of, e.g., 64,000 bits per second (bps) is compressed to, e.g., 2,400 bps for transmission over the telephone bandwidth and an automatic gain control circuit is employed to facilitate the operation of the digitized voice compression circuits, along with echo suppression being used to improve system operation.

2. Background and Summary of the Invention

It is well known in the prior art to digitize the analog signal output of, e.g., a telephone microphone, representing a voice signal, in order to transmit the digital data over a telephone line. The digitized signal, which may be converted back to an analog representation of the digital data for the purpose of transmission over the telephone lines, as is also well known in the art, is less susceptible to noise on the telephone line, is capable of multiplexed channel operation in the telephone bandwidth, reduces crosstalk and enables relatively easy digital encryption for secure transmission.

The digitized voice signal, which typically is at, e.g., 64,000 bps, cannot be readily sent within the available approximately 3,000 Hz bandwidth of the telephone lines or be readily sent multichannel at that bit rate within the available telephone line bandwidth. To enable more convenient transmission and/or multiplexed transmission, compression of the 64,000 bps digitized voice signal is employed, as is known in the art. One method of compressing the 64,000 bps to, e.g., 2,400 bps is to use a linear predictive coding technique known in the art, a discussion of which is found, for example, in Markel, Gray, Jr. & Wakita, "Linear Prediction of Speech Theory and Practice," Speech Communication Research Laboratory, Inc. Monograph No. 10 (1978), the disclosure of which is hereby incorporated by reference. With compression to 2,400 bps, four simultaneous channels of 2,400 bps each can be multiplexed via a modem onto a 9,600 bps data stream transmitted over the bandwidth of the analog telephone lines.

The linear predictive coding technique employs digital filtering of the 64,000 bps digitized voice in digital resonating filters. Only digits representative of fundamental frequencies within the analog voice signal are selected in the compression to 2,400 bps. Speech is made up of pitch (voiced and unvoiced) and amplitude components, with the pitch being derived from the action of the human vocal cords. Pitch ranges vary from adult males, 50–150 Hz, adult females, 90–450 Hz and children, 125–575 Hz. Thus, much of the fundamental frequencies in the voice of a telephone talker is eliminated from the approximately 300–3000 Hz telephone bandwidth. However, fundamental pitch frequencies can be determined from, e.g., second or third harmonics. Thus, e.g., 360 Hz is the second harmonic of 180 Hz and the third harmonic of 120 Hz. It is thus possible in the linear predictive compression technique to transmit a compressed form of digitized speech representing the fundamental pitch frequencies, the voiced speech component, and the unvoiced speech component to synthesize these at the receiver end to simulate actual speech, as is all well known in the art. In synthesizing speech at the receiver end, the unvoiced components are represented by white noise, i.e., random binary bits, which, when synthesized with the voiced components in the proper proportion, result in simulating actual speech, when the resulting synthesized digital signals at the receiver end, now expanded to 64,000 bps, are passed through a digital-to-analog converter, as is also known in the art. The linear predictive coding technique uses a linear prediction algorithm, e.g., LPC-10.

Fundamentally what the linear predictive coding does is to generate a set of, e.g., 10 numbers (envelope prediction factors) per frame at the transmitter, based upon the actual data taken from the analog-to-digital conversion of the analog speech signal, at 64,000 bps. These 10 numbers enable the receiver end to generate by use of the linear predictive algorithm a full set of, e.g., 180 points per frame, e.g., 64,000 bps digitized voice. The 10 numbers per frame, plus six bits representing pitch, six bits representing RMS gain and a sync bit are transmitted every frame, which amounts to 2400 bps. A frame in the example of the present invention is 22.5 milliseconds. The 10 numbers are generated in the transmitter from an analysis of the envelope of the digitized voice signal in the frequency domain, and enable the reconstruction of the envelope at the receiver end.

One problem with a technique like linear prediction coding is that the amplitude of the speech must be within certain limits for the prediction coding algorithm to properly analyze the digital representations of the analog speech signal to result in an accurate generation of the envelope prediction factors. Digitally controlled AGC circuits, including those in which the signals used for setting the gain of the AGC are maintained in a stored memory, are known, in the art, as shown, e.g., in U.S. Pat. Nos. 4,213,097 to Chiu et al. (assigned to the assignee of the present application); 4,016,557 to Zitelli et al.; 3,464,022 to E. W. Locheed, Jr., et al.; 3,699,325 to Montgomery, Jr., et al.; 3,813,609 to Wilkes, et al.; 3,562,504 to Harris. The actual gain value sent to the receiver at the end of the transmission link may not be accurate if gain has been adjusted at the transmitter end in order to keep the gain within the linear prediction coding analyzer's limits. The prior art has not adequately solved these problems. U.S. Pat. No. 4,230,906 to Davis describes an AGC circuit for stabilizing speech waveforms for pitch. The function described is pitch detection and the stabilization is to provide a uniform input in pitch, i.e., uniform amplitude for the purpose of period detection, not for envelope detection.

There are presently in use both two-wire and four-wire telephone transmission links. In the two-wire system, analog speech or data signals are transmitted in both directions with two wires. In the four-wire system there are two wires, each with an associated ground wire, e.g., one for transmitting and one for receiving.

Because of processing delays inherent in the compression/expansion of digitized voice, echo suppression is of crucial importance. The prior art has not adequately solved this problem.

SUMMARY OF THE INVENTION

The present invention relates to employing at the transmitter end a linear prediction coding analyzer which is interfaced with a digital-to-analog automatic gain control circuit and controls the automatic gain control circuit to maintain the linear prediction coding analyzer within a proper range of gain settings to ensure the linear prediction coding algorithm can be properly utilized. The transmitter software is thus also possessed of data indicating to what extent the gain has been so adjusted, so that the gain information transmitted each frame can be adjusted by that amount to thereby reflect actual gain of the digitized voice signal for proper synthesis at the receiver end. In addition, the present invention relates to features which assist in echo suppression. Echo suppression includes software implementation in the present invention enabling suppression of the same echo signal at its originating end of the transmission link and at the receiver end, and also includes use of, e.g., an operational amplifier hybrid circuit.

The problems enumerated in the foregoing have not been intended to be exhaustive, but rather are representative of problems which have tended to impair the effectiveness of limited bandwidth, e.g., telephone bandwidth, digital voice transmission apparatus used in the prior art, particularly those using multichannel transmission within the telephone bandwidth. Other noteworthy problems may also exist; however, those presented above should be sufficient to demonstrate that limited bandwidth, e.g., telephone bandwidth digital voice transmission apparatus appearing in the prior art have not been altogether satisfactory.

Similarly, the foregoing examples of the more important features of the present invention have been given rather broadly in order that the detailed description thereof which follows may be better understood and the contribution to the art better appreciated. There are, of course, additional features of this invention that will be described hereinafter and which will form the subject matter of the appended claims. These other features of the present invention will become apparent with reference to the following detailed description of a preferred embodiment of the invention in connection with the accompanying drawings, wherein like reference numerals have been applied to like elements, in which:

DESCRIPTION OF THE INVENTION

Figure 1:
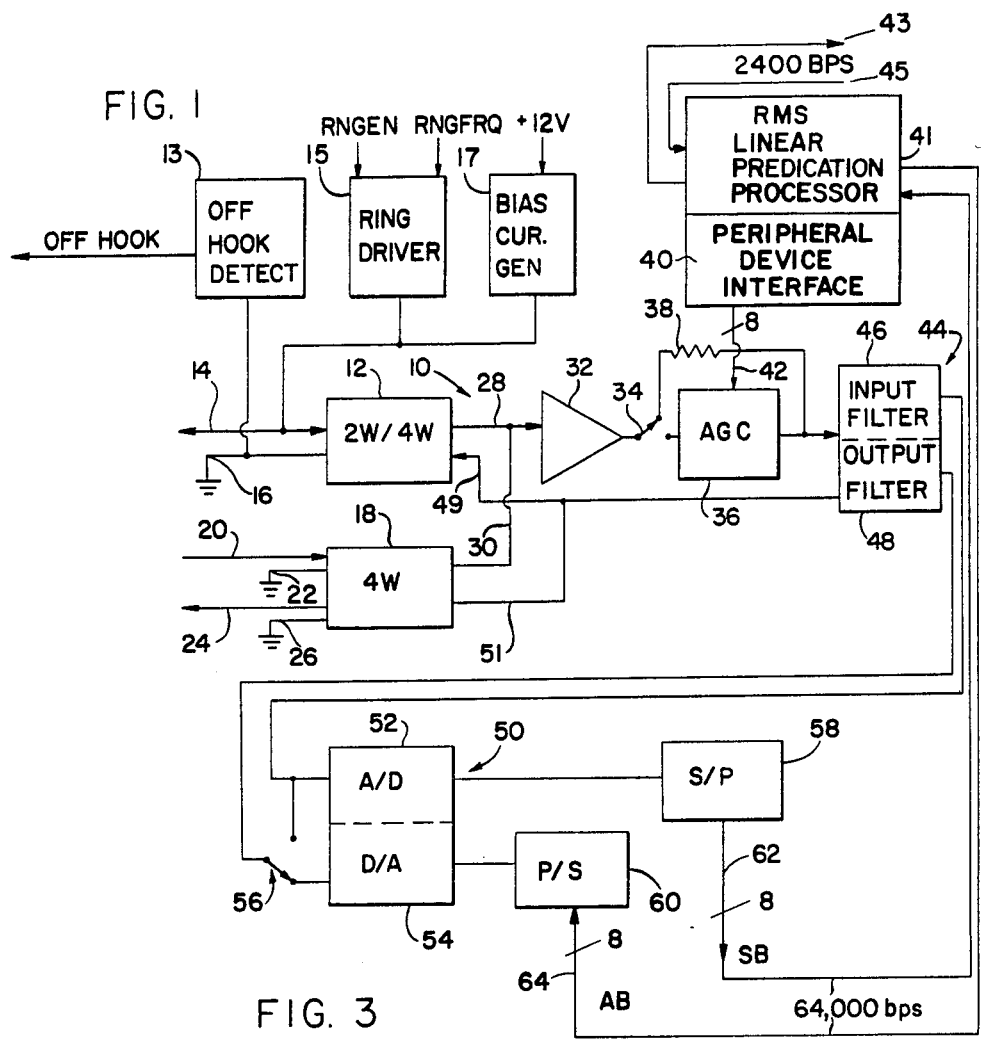
FIG. 1 shows a block diagram of an analog input/outputs circuit for digitized voice compression/expansion and employing the automatic gain control and echo suppression features of the present invention.

Shown in FIG. 1 is a block diagram of an analog input/output circuit 10 for digitized voice compression and expansion in accordance with the present invention. The circuit 10 is adapted for connection either to a two-wire or four-wire telephone transmission link and thus has a two-wire to four-wire interface 12 and a four-wire interface 18. The two-wire to four-wire interface 12 is connected to two-wire telephone transmission lines 14 and 16. The four-wire interface 18 is connected to a telephone receive on input 45 link 20, having an associated ground connection 22, and a telephone transmission link 24, having an associated ground connection 26.

Each of the two-wire to four-wire interface 12 and four-wire interface 18 is connected to a spectrum shaping amplifier 32. The spectrum shaping amplifier 32 is connected through a suitcase strap or a selector switch 34 to an automatic gain control (AGC) section 36, with the switch 34 also having a position selecting an AGC 36 bypass through a 47 Kohm bypass resistor 38. The output of the AGC 36 section and the bypass resistor 38 are connected to the input filter half 46 of the bandpass filter 44 which passes only energy in the telephone line bandwidth from about 300–3000 Hz. The output filter half 48 of the same bandpass filter 44 is connected to the telephone handset speaker input 49 of the two-wire to four-wire interface 12 and to the telephone handset speaker input 51 of the four-wire interface 18.

The input filter 46 is connected to an analog-to-digital converter half 52 of an analog-to-digital/digital-to-analog converter 50 (A/D/A converter), the output of which is serialized digital data at 64,000 bps, representative of the analog input to the analog-to-digital half 52. This serialized data at 64,000 bps is passed to a serial-to-parallel converter 58 which provides an 8-bit word on output line 62 to an RMS linear prediction analyzer portion of a linear prediction processor 41. The linear prediction analyzer portion of the processor 41 performs the compression of the 64,000 bps output of the serial-to-parallel converter 58 to 2,400 bps for transmission and a linear prediction synthesizer portion of the processor 41 performs an expanding conversion of 2,400 bps received data to eight-bit words at 64,000 bps, which is an input on line 64 to a parallel-to-serial converter 60. The 2,400 bits as compressed by the processor 41 is transmitted via output 43 coupled to, e.g., a modem (not shown) to a remote location, and the 2,400 bps as expanded by the synthesizer portion of the processor 41 is that which has been received from a remote location, e.g., through a modem, (not shown) and the expanded 64,000 bps is used locally to drive, e.g., a telephone handset speaker (not shown). The parallel-to-serial converter 60 is connected through a digital-to-analog converter 54 half of the A/D/A converter 50 and a suitcase strap 56 to the output filter half 48.

The RMS analyzer portion of the processor 41 has a PDI section which provides an eight-bit control signal on line 42 to the AGC section 36, depending upon the value of the root mean square (RMS) determined in the processor 41 during the compression function, as will be more fully explained below.

Figure 2:
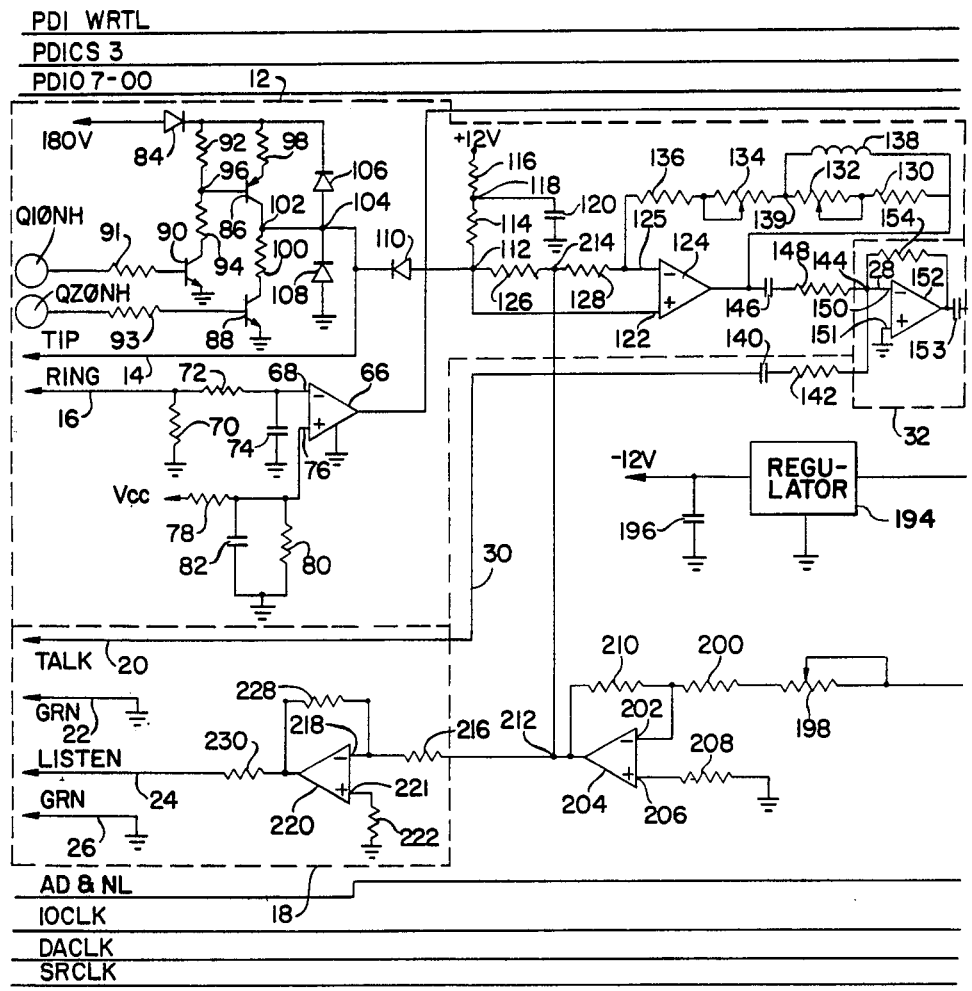
FIGS. 2 and 2A are a more detailed schematic diagram of the circuit of FIG. 1.
Figure 2A:
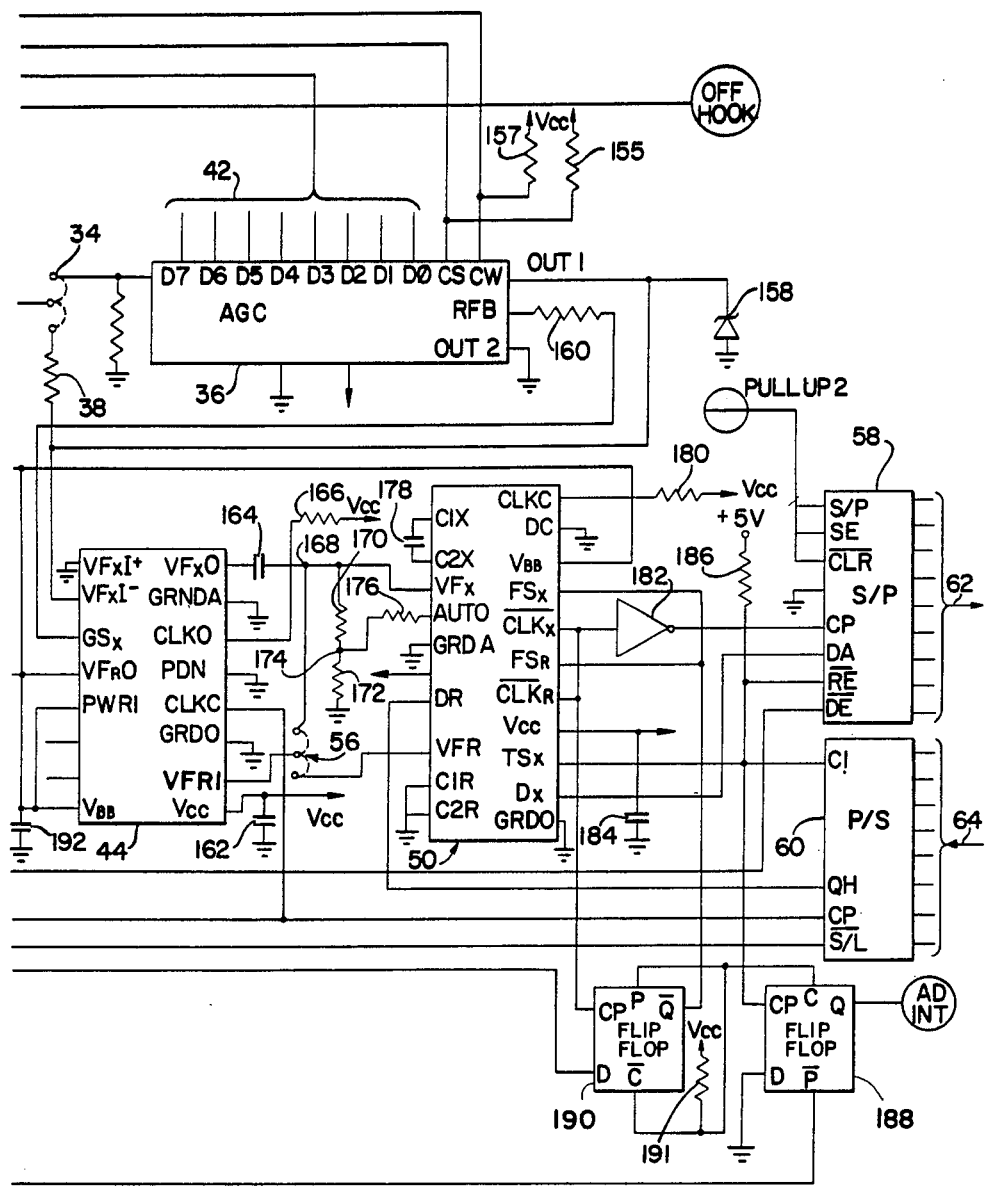

Shown in FIGS. 2 and 2A is a more detailed schematic view of the circuitry of FIG. 1. The two-wire to four-wire interface contained within phantom lines 12 is shown to have an off-hook detector amplifier 66, the negative input 68 of which is connected to RING line 16 through a 160 Kohm resistor 72. The RING line is connected to system ground, through a 47 ohm resistor 70. The negative input 68 of the amplifier 66 is connected to system ground through a 1 microfared capacitor 74.

The positive input 76 of the amplifier 66 is connected to system supply voltge $V_{cc}$ through a 10 Kohm resistor 78 and is connected to system ground through the parallel connection of a 1.6 Kohm resistor 80 and a 0.01 microfarad capacitor 82. The output of amplifier 66 is connected to an OFF HOOK line, which gives an OFF HOOK enabling signal to the analyzer 41 software.

The two-wire to four-wire interface 12 is also shown to have a high voltage ringing circuit connected to 180 V through a diode 84. The diode 84 is a 1N4004 rectifier diode. The high voltage ringing circuit includes transistors 86, 88 and 90. Transistor 86 is a PNP transistor, e.g., a 2N5415, having its base connected through a 4.7 Kohm resistor 92 to the diode 84 and through a 27 Kohm resistor 94 to the collector of an NPN transistor 90, e.g., a 2N3439 the emitter of which is connected to ground. The emitter of the transistor 86 is connected to the diode 84 through a 47 ohm resistor 98 and the collector of the transistor 86 is connected through a 47 ohm resistor 100 to the collector of an NPN transistor 88, e.g., a 2N3439, the emitter of which is connected to ground.

The bases of transistors 88 and 90 are connected to TTL level signals Q1ÅNH and Q2ÅNH through, respectively, an 82 Kohm resistor 91 and a 360 ohm resistor 93.

A node 102 between the collector of the transistor 86 and the resistor 100 is connected to a node 104 between the anode of a diode 106 and cathode of a diode 108. The cathode of the diode 106 is connected to the cathode of the diode 84 and the anode of diode 108 is connected to ground. The node 104 is connected to the TIP line and to the cathode of a diode 110, the anode of which is connected to a node 112. Each of the diodes 106, 108 and 110 are IN4004 diodes.

Node 112 is connected to a +12 V bias supply through an 82 ohm resistor 114 and an 82 ohm resistor 116, a node 118 between which is connected to ground through a 0.01 micro-farad capacitor 120. Node 112 is connected to the positive input 122 of an impedance matching hybrid operational amplifier 124 (hereinafter "the hybrid operational amplifier"). The negative input 125 of the hybrid operational amplifier 124 is connected to node 112 through a 1.2 Kohm resistor 128 and a 1.2 Kohm resistor 126. The hybrid operational amplifier 124 has a negative feedback loop consisting of a 27 ohm resistor 130, a 100 ohm variable resistor 132, a second 100 ohm variable resistor 134 and a second 27 ohm resistor 136, with a 55 millihenry inductor 138 connected between the variable resistors 132, 134 and the output of the hybrid operational amplifier 124. The output of the hybrid operational amplifier 124 is connected to a node 144 through a 0.068 microfarad capacitor 146 and a 9.1 Kohm resistor 148. Node 144 is the output 28 of two-wire-to-four-wire interface 12 and is connected to the output 30 of the four-wire interface 18, described in further detail below, through a 0.033 microfarad capacitor 140 and an 18 Kohm resistor 142.

Node 144 is connected to the negative input 150 of the spectrum shaping operational amplifier 152 contained within section 32, the positive input 151 of which amplifier 152 is connected to ground. The operational amplifier 152 has a negative feedback loop to the negative input 150 through a 39.2 Kohm resistor 154. The output of the operational amplifier 152 is connected to switch 34, shown in FIG. 2A, through a 0.068 microfarad capacitor 153.

One position of switch 34 directs the output of operational amplifier 152 to the AGC circuit 36 and a 47 Kohm AGC input resistor 156 connected to ground. The AGC circuit 36 is, e.g., an AD7524 made by Analog Devices of Norwood, Mass. The AGC circuit 36 has inputs D7–D0 from PDI pins PDI07–00 from the analyzer 41 (shown in FIG. 1) and CS and CW inputs from PDICS3 and PDI WRTL from the analyzer 41, with the CS and CW inputs also connected to $V_{CC}$ through 1 Kohm resistors 155 and 157, respectively.

The output, OUT 1, of the AGC circuit 36 is connected to the $VF_xI^-$input of an Intel 2912 filter 44, which $VF_xI^-$input is also connected to a second position of switch 34 through the 47 Kohm AGC bypass resistor 38. The output, OUT 1 of the AGC 36 is also connected to ground through a zener diode 158, e.g., a 1N5711 diode made by Hewlett-Packard. The $VF_xI^+$input to the filter 44 is grounded. The $GS_x$ pin of the filter 44 is connected to RFB in the AGC circuit 36 through a 39 Kohm resistor 160. The $V_{cc}$ pin of the filter 44 is connected to $V_{cc}$ and also is connected to ground through a 0.01 microfarad capacitor 162. The CLKO pin of the filter 44 is connected to $V_{cc}$ through a 1 Kohm resistor 166. The $VF_x$ output pin $VF_x0$ of the filter 44 is connected to the $VF_x$ input of the analog-to-digital half 52 of the A/D/A converter 50 through a 0.3 microfarad capacitor 164 and to the AUTO input pin of the A/D converter through voltage dividing resistors 170, a 150 Kohm resistor, and 172, a 332 ohm resistor, and through a 475 Kohm resistor 176, connected to the node 174 between the resistors 170 and 172. The A/D converter 50 is an Intel 2911.

The VFRI input pin of the output half 48 of the filter 44 is connected through a switchcase strap or a switch 56 to either the $VF_x$ pin or the VFR pin of the A/D/A converter 50. The C1X and C2X pins of the A/D/A converter are connected through a 2200 picofarad capacitor 178.

The CLKC pin of the filter 44 is connected to the IOCLK line. The CLKC pin on the A/D/A converter 50 is connected to $V_{cc}$ through a 1 Kohm resistor 180. The $TS_x$ pin on the A/D/A converter 50 is connected to the $\overline{RE}$ pin on the serial-to-parallel converter 58 and the $\overline{CI}$ pin on the parallel-to-serial converter 60, and also is connected to a +5 v source through a 1 Kohm resistor 186. The $\overline{CLK_x}$ pin on the A/D/A converter 50 is connected through an inverter 182 to the CP pin on the serial-to-parallel converter 58 and to the $\overline{CLK_R}$ pin of the A/D/A converter 50. The QH pin of the parallel-to-serial converter 60 is connected to the DR pin of the A/D/A converter 50. $V_{cc}$ of the A/D/A converter 50 is connected to $V_{cc}$ across a 0.01 microfarad capacitor 184. The $D_x$ pin of the A/D/A converter 50 is connected to the DA pin of the serial-to-parallel converter 58.

The $\overline{DE}$ pin of the serial-to-parallel converter 58 is connected to the AD & NL line. The S/P, SE and $\overline{CLR}$ pins of the serial-to-parallel converter 58 are connected to the PULLUP 2 line. A pair of flip-flops 188 and 190 serve to generate an interrupt signal on the ADINT line and a reset signal on the ADRST line in response to a clock signal on the SRCLK line. This is a timing function to inform the analyzer 41 when data is ready to be sent from the serial-to-parallel converter 58 and data is ready to be received by the parallel-to-serial 60. Also the flip-flops 188 and 190 control the timing of transfer of data from the A/D/A converter 50 to or from the converters 58 and 60. The flip-flops 188 and 190 are connected to $V_{cc}$ through a 1 Kohm resistor 191.

Negative voltage of $-5$ V is supplied to $V_{BB}$ of the filter 44 across a 1 microfarad capacitor 192, and to $V_{BB}$ of the A/D/A converter 50, from an A79M05 voltage regulator 194 (shown in FIG. 2) made, for example, by Fairchild of Mountain View, Calif., which is supplied with $-12$ V across a 2 microfarad capacitor 196.

As shown in FIG. 2 the output $VF_R0$ of filter 44 for driving the speaker in the telephone handset is connected through a 10 Kohm variable resistor 198 and a 10 Kohm resistor 200 to the negative input 202 of an operational amplifier 204, the positive input 206 of which is connected to ground through an 8.2 Kohm resistor 208. The operational amplifier 204 has a feedback loop to the negative input 202 thereof through a 27 Kohm resistor 210.

The output of the operational amplifier 202 is connected to a node 212, which is connected to a node 214 between the resistors 126 and 128, and forms the output for the signal to be passed through the two-wire to four-wire interface to the TIP line 14 for driving the telephone speaker in the full duplex system on the tip line 14. Node 212 is also connected to the four-wire interface 18 through an 18 Kohm resistor 216.

The telephone speaker drive line 24 is connected through a 619 ohm resistor 230 to the output of an operational amplifier 220, a negative input 218 of which is connected to the resistor 216 and a positive input 221 of which is connected to ground through a 13 Kohm resistor 222. The operational amplifier 220 has a feedback loop connected to the negative input 218, including the parallel connection of a 9.1 Kohm resistor 228.

Figure 3:
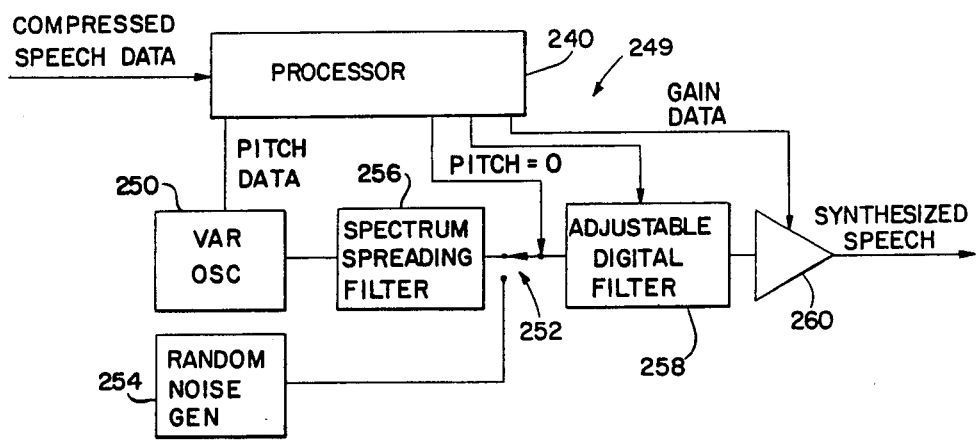
FIG. 3 shows a block diagram of a digital voice synthesizer employed in the receiver of a voice transmission link using the present invention.

FIG. 3 shows a block diagram of a synthesizer 249 contained in the processor 41 in the present invention. During each frame of 54 bits contained within the 2,400 bps received from the remote location via, e.g., a modem (not shown), the synthesizer portion of the processor 41 receives through a process 240 six bits of decoded data representing pitch, six bits of decoded data representing gain, 1 sync bit, and 10 words of variable bit length from 5 to 2, totalling 40 bits of data from which the synthesizer 249 contained in the processor 41 software, using the linear predictive algorithm, generates 180 points defining the frequency spectrum envelope of the analog speech to be synthesized. The pitch data is employed to drive an oscillator 250 at the proper pitch. If pitch for that frame is 0, then an electronic switch 252 in the synthesizer 249 is in the position to be supplied with random digital numbers, i.e., noise, from a random number generator 254. The oscillator 250 is connected to the switch 252 through a filter 256 which spreads the spectrum of the oscillator 250 about its oscillating frequency for better approximation of speech by the synthesizer 249. When the switch 252 is the position shown in FIG. 3, the voicing decision is a voiced decision and when it is in the position to receive noise, it is an unvoiced decision A filter 258 is an adjustable digital filter, the output of which is controlled by the 10 numbers defining the frequency spectrum envelope for that frame, as generated by the synthesizer portion of the processor 41. This results in an output of the filter 58 which corresponds quite closely to the analog speech signal in the time domain originally digitized and compressed for transmission. This signal is amplified in a gain amplifier 260 according to the value of the gain (RMS) for that frame. This value is equal to the measured RMS, which the analyzer 41 at a remote location computed in performing the linear prediction coding, adjusted for the gain or attenuation, if any, introduced in the AGC section 32 at the remote location to ensure proper operation of the analyzer 41 at the remote location in compressing the digitized voice at 64,000 bps to 2,400 bps by use of the linear prediction algorithm. Therefore it is the true gain necessary to duplicate the original analog speech in volume.

Figure 4:
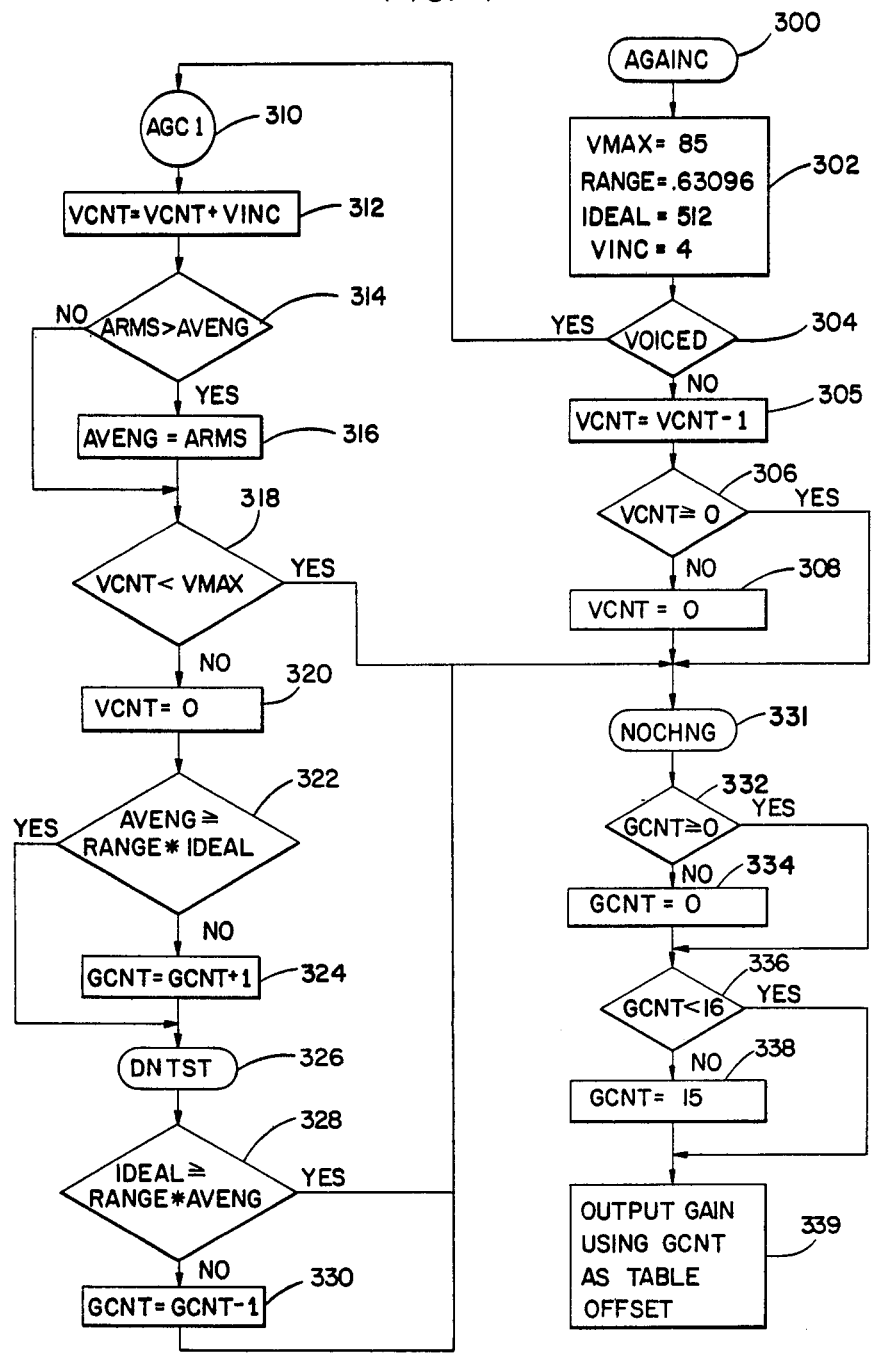
FIG. 4 shows a flow chart for software implementation of automatic gain control in accordance with the present invention.

The software implementation of automatic gain control at the speaker's end of the transmission link provided by the analyzer 41 at that end during voice compression is shown in the flow chart of FIG. 4. Modification of the gain in the AGC 36 is dependent upon the RMS value in the analyzer 41. A programmed data processor or hard wired large scale integrated circuit, e.g., a microprocessor controller in the analyzer 41 starting at start 300 (AGAINC) first sets the values for VMAX=85, RANGE=0.63096, IDEAL=512 and VINC=4 in block 302. A decision is then made in block 304 between whether the voicing decision in a given frame is a voiced decision or unvoiced decision, i.e., is there a pitch value or is pitch=0. If it is unvoiced the count VCNT in an AGC accumulator within the microprocessor in the analyzer 41 is decremented by 1 in block 305. The count VCNT in the accumulator is then checked in block 306 to see if it is greater than or equal to zero. If it is not greater than or equal to zero the count VCNT is set at zero in block 308.

Returning to block 304, if the decision is a voiced decision the AGC1 loop is started at 310. The VCNT is incremented in block 312 by VINC which equals 4. The present value of RMS in the analyzer 41, ARMS, is then compared in block 314 to see if it is greater than the most recent peak value AVENG of ARMS. If it is greater, then AVENG is set to equal present ARMS in block 316 representing now the most recent peak. Regardless of whether AVENG needs to be reset, the accumulated value of the AGC accumulator VCNT is then compared in decision block 318 to see if it is less than the preselected value of VMAX, in this case 85. If it is, the no change NOCHNG instruction is initiated in block 320. The result of the unvoiced instructions in blocks 305, 306 and 308 is also to ultimately initiate NOCHNG, as shown in FIG. 4.

Returning now to block 318, if VCNT is not less than VMAX, VCNT is set to zero in block 320 and a decision is made whether to adjust the gain of the AGC 36. The most recent peak ARMS, AVENG, is compared in block 322 to see if it is greater than or equal to generally a midpoint selected value, IDEAL, in this case 512, and also if the difference between AVENG and IDEAL is less than or equal to some value, RANGE. If it is not $\geq$ to IDEAL and the difference is not $\leq$ RANGE then value GCNT in the gain accumulator is incremented in block 324 to GCNT +1. After this, or if the decision in block 322 is a yes decision, then the DNTST instruction is started in block 326. In block 328 IDEAL is compared to see if it is greater than or equal to AVENG and if the difference between the AVENG and IDEAL is less than or equal to RANGE. If IDEAL is not less than or equal to AVENG, and the difference is not less than RANGE, the count GCNT is decremented by 1 in block 330. Regardless of whether GCNT is decremented, the next instruction executed is to start NOCHNG at block 331. If the count in the gain accumulator GCNT is less than 0 it is reset to 0 by the combination of the steps in blocks 332 and 334. If GCNT is not less than 16 it is reset to 15 by the combination of the steps in blocks 336 and 338. The next instruction in block 339 provides for a look up in a memory table in the analyzer 41 of a gain control signal to be provided to the AGC 36 on lines PDI07–00 from the analyzer 41, based upon the value of GCNT.

Thus the AGC controller in the analyzer 41 microprocessor assigns a value of −1 to unvoiced decisions and +4 to voiced decisions. These are accumulated from frame to frame during the processing by the analyzer 41 for making gain adjustment decisions for use in the AGC 36 and correspond to whether there was data in the respective frame indicating that pitch was present in the frame, as transmitted to the remote location in the frame data. Only if VCNT exceeds VMAX is a gain change permitted. This ensures that a speech-like signal is present and that enough intervals have occurred on which to base a gain decision. Thus the AGC 36 in the apparatus of the present invention is adjusted only in response to speech signals and only to keep these signals within the range necessary for proper processing by the analyzer 41 in accordance with the linear predictive algorithm.

Once VCNT exceeds VMAX, an AGC 36 gain decision is made and VCNT is then set to zero to prevent rapid gain changes in the AGC 36. The parameter used during voiced intervals is the most recent peak ARMS in the analyzer 41 (AVENG) which is compared with the value representative of the desired RMS. The sign of the difference, as determined in the software, determines the direction of the gain change. No change is made if the magnitude of the difference is less than a preselected value, RANGE, since no change is needed if the magnitude of the difference is such that the measured ARMS energy is close to the selected IDEAL. If the difference is greater than the selected RANGE then a one-step change of ±2 db is made in the AGC 36, and AVENG is reset to zero so that the next measured ARMS will become AVENG.

The gain change is made by incrementing or decrementing by one a four-bit counter GCNT within the microprocessor in the analyzer 41. The count GCNT in this counter is used within the software in the analyzer 41, used for controlling the AGC 36, to address a corresponding memory location and the new gain setting contained therein is written to the AGC 36 on lines PDI07–00.

IDEAL is set at 512, which is half scale for the RMS parameter. RANGE is a multiplier 0.63096 which corresponds to 4 db (4=20 log (1/0.63096). VMAX is empirically set at 85.

The analyzer 41 receives data at 64,000 bps from the serial-to-parallel converter 58 and compresses this data according to the linear predictive algorithm. In the process it computes RMS on a frame-by-frame basis and performs the decision-making process of whether to adjust the gain of the AGC 36. The gain of the AGC 36 is thus available data for the analyzer 41, which transmits, via, e.g., a modem (not shown), the true gain (i.e., the ARMS adjusted by whatever value the AGC 36 gain has been adjusted to maintain the analyzer 41 in the proper range for accurately performing the linear prediction algorithm) as part of the frame data, to an analyzer 41 at a remote location. Using the actual data for a frame, the analyzer 41 computes the best set of, e.g., 10 linear prediction algorithm factors, from which the remote analyzer 41 can reconstruct the full 180 points of digital data representing the frequency domain spectrum envelope for synthesis by a synthesizer 249 contained in the remote analyzer 41 to simulate a voice signal which is an analog signal.

The analyzer 41 also receives compressed 2,400 bps data from a remote analyzer 41 via, e.g., a modem (not shown). Using this data, and the linear predictive algorithm, it generates a frequency domain spectrum envelope for each frame. It also receives pitch and gain data for each frame and from the pitch, gain and envelope data it synthesizes in its synthesizer portion 249 a 64,000 bps digital voice signal which is converted in the A/D/A converter 50 to drive the speaker in the local telephone handset.

Echo suppression of the present invention is partially software implemented and includes also circuitry within the two-wire-to-four-wire interface 12 which functions as an echo suppressor in the manner of balancing network couplers in the prior art. These employ transformers to accomplish echo suppression by balancing impedances. The echo suppressor of the present invention is particularly suited to the present system employing digitized voice. In the interface circuitry of the present invention the hybrid coupler of the prior art is replaced with a hybrid coupling operational amplifier 124.

The source of echo in the interface circuitry of the present invention is the two-wire to four-wire load balancing circuit including operational amplifier 124. As the impedance of the two-wire load, i.e., the telephone, varies from the impedance the balancing circuit expects to see, a larger amount of the synthesizer 249 output signal at node 214 is reflected into the analog input to the analyzer 41 through the spectrum shaping amplifier 32.

Figure 5:
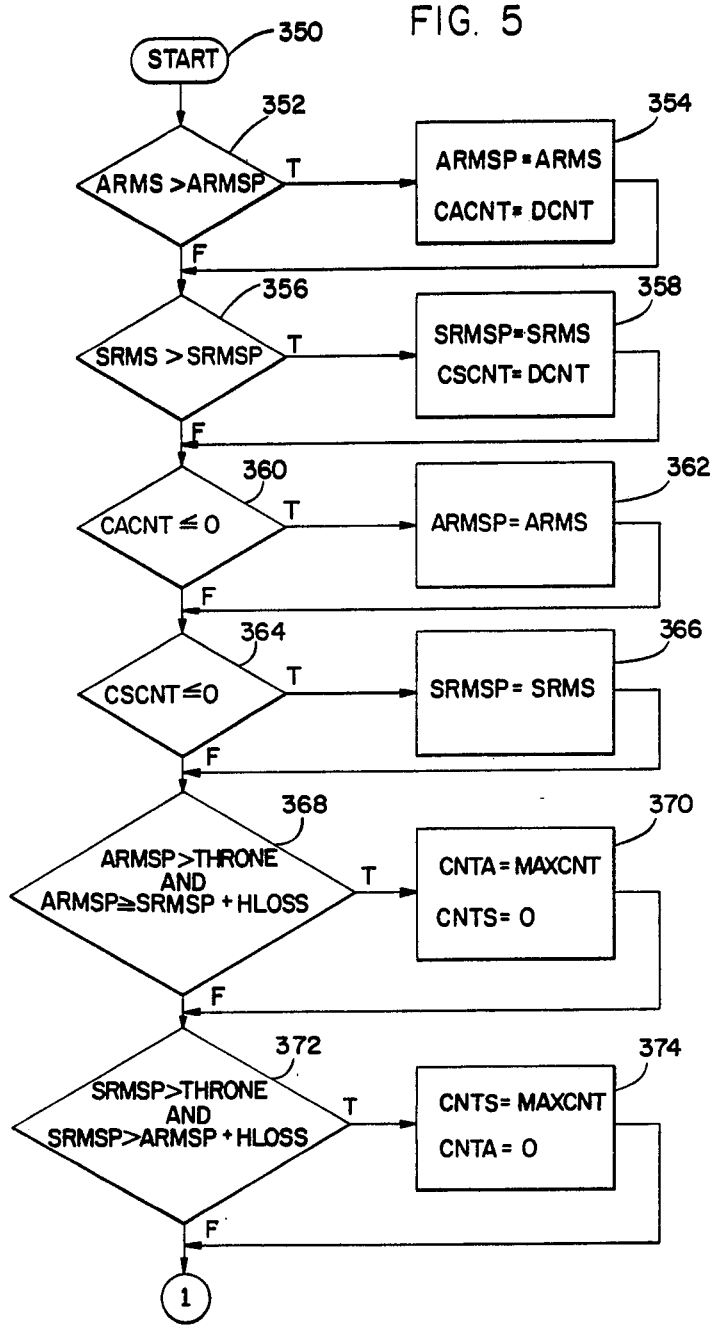
FIGS. 5 and 5A show a flow chart for software implementation of echo suppression in accordance with the present invention.

Because of the processing delay inherent in digital voice transmission, especially employing data compression and expansion, even small amounts of echo are annoying to the talker. The echo suppression employed in the present invention effectively eliminates this residual echo, and the flow chart for the software implementation is shown in FIG. 5.

Echo suppression is carried out by a combination of the use of the balancing hybrid operational amplifier 124 and software analysis of the near talker RMS in the analyzer 41, ARMS, and the far talker RMS in the synthesizer, 249, SRMS. This determines whether the user at the respective end of the transmission link is talking or listening during each frame and accordingly attenuates ARMS or SRMS. This process begins in software, e.g., in the analyzer 41, at START 350. In decision block 352 the ARMS is compared to see if it is greater than the most recent peak ARMS, i.e., ARMSP. If it is then the ARMSP value is set to the present ARMS value in block 354. Since decisions are made each frame regarding which signal to suppress in order to suppress echo effectively during pauses and at the end of talking, two delay functions are employed. The first is to hold ARMSP at its most recent value for a selected time. This is done in block 354 by setting the count CACNT in an accumulator in the analyzer 41 to DCNT, equal to 16, and which CACNT is decremented by 1 each frame for a total of 16 frames, as long as ARMS is less than or equal to ARMSP.

In decision block 356 SRMS is compared to SRMSP, the most recent peak SRMS. If it is greater, then SRMSP is set to equal the present SRMS in block 358. Also for the reasons explained above a delay counter accumulator count CSCNT in an accumulator in the analyzer 41 is set to equal DCNT and is decremented by 1 once each frame for 16 frames as long as SRMS is less than or equal to SRMSP.

In decision block 360 CACNT is compared to 0 and if less than or equal to 0 ARMSP is set at the present value of ARMS in block 362. This same function is performed in decision block 364 and block 366 with respect to CSCNT and SRMSP equal to the present SRMS.

A decision whether to attenuate SRMS is made in decision block 368 by comparing ARMSP to a value THRONE set at two-fifths scale, and also comparing to see if ARMSP is greater than or equal to SRMSP plus a fraction of the hybrid loss HLOSS. The first condition makes certain that a reasonable volume of speech is being transmitted/received and the second condition makes certain that the received energy is smaller, even when a correction is made for hybrid impedance mismatch. If these conditions are met an attenuating counter for the synthesizer CNTA is set in block 370 at MAXCNT, e.g., 16 and an attenuating counter for the analyzer CNTS is set to zero. This results in SRMS attenuation at, e.g., 12 db each frame for as long as CNTA is greater than 0.

Similarly if SRMSP is greater than THRONE and SRMSP is greater than ARMSP+HLOSS a decision is made in decision block 372 which results in block 374 in the setting of an attenuating counter CNTS for the analyzer at MAXCNT and the attenuating counter CNTA for the synthesizer at 0, to attenuate ARMS for a selected number of frames as CNTS decrements each frame from MAXCNT which may be, e.g., 16.

Figure 5A:
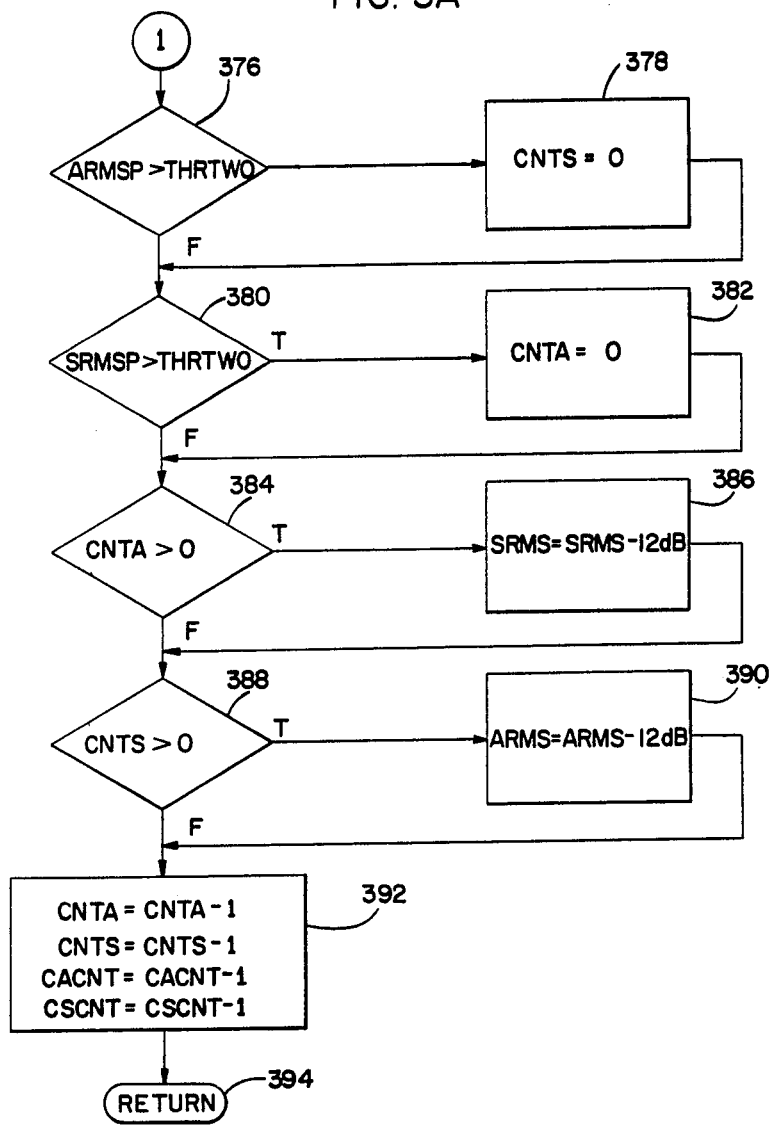

Moving on to FIG. 5A it is seen that ARMSP and SRMSP are then compared in decision blocks 376 and 380, respectively, with a second threshold value THRTWO, equal to four-fifths scale. If either is greater than this value then, respectively, the far talker or near talker is interrupting and attenuation must be accordingly removed. This is done in blocks 378 and 382 by setting, respectively, CNTS or CNTA equal to 0.

Decision blocks 384 and 386 control the actual attenuation so long as, respectively, CNTA is greater than 0 or CNTS is greater than 0. In the former event SRMS is set in block 386 to equal SRMS minus, e.g., 12 db and in the latter event ARMS is set in block 390 to equal ARMS minus, e.g., 12 db.

The decrementing function is performed in block 392 by setting CNTA, CNTS, CACNT and CSCNT each equal to their respective values minus 1. The program then returns to START from RETURN 394, to begin processing the data for the next frame.

Thus it can be seen that the software at each end of the transmission link functions to attenuate the proper value, either SRMS or ARMS depending on whether the near talker or far talker, as perceived by each respective end of the transmission link, is the actual talker, the other signal, either SRMS or ARMS, being thereby determined to be echo and being attenuated to suppress the echo.

Echo suppression also occurs in the four-wire interface section of the two-wire to four-wire converter. The voltage at node 112, $V_{112}$ is given by equation 1.

$$V_{112} = \frac{V_T R_{126} + V_S Z_T}{R_{126} + Z_T} \quad (1)$$

where:

$V_T$ = telephone MIC output voltage
$Z_T$ = telephone impedance
$V_S$ = voltage at the output of operational amplifier 204 (the synthesizer output)

Since the operational amplifier 124 is operating with negative feedback, its negative input will track the positive input. A second node equation at the output of the amplifier 124 yields:

$$\frac{V_{112} - V_0}{R_f} + \frac{V_{112} - V_S}{R_{128}} = 0 \quad (2)$$

where:

$V_0$ is the voltage at the output of the operational amplifier 124 (the analyzer input)
$R_f$ is the equivalent resistance of the feedback resistance inductance network of the operation amplifier 124.

Substituting for $V_{112}$ from equation 1 yields:

$$\frac{V_0}{R_f} = V_S \left[ \left( \frac{Z_T}{R_{126} + Z_T} \right) \left( \frac{1}{R_f} + \frac{1}{R_{128}} \right) - \frac{1}{R_{128}} \right] + V_T \left( \frac{R_{126}}{R_{126} + Z_T} \right) \left( \frac{1}{R_f} + \frac{1}{R_{128}} \right) \quad (3)$$

For proper operation there should be no $V_S$ signal component in $V_0$. For this to occur, the first term on the right side of equation 3 must equal zero. That term equals zero when:

$$\frac{Z_T}{R_{126} + Z_T} = \frac{R_f}{R_{128} + R_f}$$

In the design of the present invention, this requirement is satisfied using $R_f = Z_T$ and $R_{128} = R_{126}$. Substituting these values into equation 3 yields $V_0$ as a function of the microphone signal:

$$V_0 = V_T$$

In order to empirically match $Z_T$, measurements were taken of the telephone impedance above a range of about 100 to 4000 Hz at a bias current of 16 ma. From this data a matching network according to the present invention was synthesized. Since telephone impedances vary from unit to unit, two adjustments are included in the network by way of the variable resistors 132 and 134 and 198 in order to improve the nominal matching.

The performance of the two-wire to four-wire converter 12 is more critical in the present invention than in a normal telephone channel since the processing delay inherent in the use of digitized voice will produce sufficient delay in the echo path of the converter 12 (synthesizer out to analyzer in) to disturb the normal cadence of the talker.

Once adjusted, the circuit yields approximately 40 dB of loss in the echo path across the 100 to 4000 Hz spectrum. To null the circuit a signal (1000 Hz, sinusoidal, 0.814 VRMS) is inserted at the center post of suitcase strap 56 (with the strap removed). Variable resistor 198 is adjusted (Rx Gain Pot) to produce 1.1±0.2 VRMS at the output of amplifier 204. This adjusts the receive gain and provides a reference signal for the two-wire to four-wire balance adjustment. The balance adjustment must be made with the telephone connected to the RING and TIP lines and with OFF HOOK activated. Monitoring the output of the amplifier 152, variable resistor 132 and 134 are adjusted to null the signal at that point. The signal level at that point should be at least 35 dB lower than at the output of amplifier 204.

The principal features of the operation of the present invention will be now described with reference to FIGS. 2 and 2A. Bias current for the telephone is produced using a series resistor network 116 and 114 to +12 volts with a decoupling capacitor 120 to ground.

The ring driver 15 consists of a totem pole driver circuit which includes transistors 86, 88 and 90 and associated discrete components. The circuit uses the TTL level signals Q10NH and Q20NH to alternately switch the TIP line between 180 V and ground. The design of the TTL drive signals includes a "dead time" between state changes in which both transistor 88 and transistor 86 are off.

Diodes 108 and 106 limit the spiking which occurs when the current in the bell coil of the telephone (not shown) tries to change rapidly. Diode 110 isolates the ringing voltage from the two-wire to four-wire converter 12. When the ring driver 15 is active the voltage at node 112 will swing from 0 to +12 V, at which point diode 110 turns off, while the cathode side of diode 110 continues toward 180 V.

When the ring driver 15 is inactive both halves of the totem pole driver circuit are off, thereby presenting a very high impedance to the TIP line and having no effect on the two-wire to four-wire converter 12 balance.

The hookswitch status detection is accomplished by the amplifier 66 and its associated discrete components. Resistor 70 is a DC current sense resistor. The voltage across resistor 70 is low pass filtered at 1 Hz by resistor 72 and capacitor 74 and compared (via amplifier 66) to a fixed threshold at the junction of resistors 78 and 80. In operation there are four combinations of ring state and hookswitch status which the status detection circuitry must recognize. Each combination is described below.

1. Ring Active, ON HOOK—for this state (which occurs when a call is received) the TIP and RING leads are AC coupled through the telephone bell circuit. The voltage across the sense resistor 70 is therefore an AC signal (f approximately 20 Hz). The 1 Hz LPF (resistor 72 and capacitor 74) prevents excursions of this signal from exceeding the threshold and the ONHOOK status does not change.

2. Ring Active, OFF HOOK—in this state (which occurs when a call is answered) the TIP and RING lines are DC coupled through the telephone. The LPF capacitor 82 charges to the average value of the ring signal, which exceeds the preselected threshold and generates the OFFHOOK status, which should then be sensed by software to turn off the ring signal.

3. Ring Inactive ON HOOK—in this state (which occurs when the telephone is no longer being used) the TIP and RING lines are again AC coupled. No bias current can flow through the TIP and RING lines and the voltage across resistor 70 drops below the threshold (to 0V) producing the ON HOOK indication.

4. Ring Inactive, OFF HOOK—in this state (which occurs when a call is initiated or in-progress) the TIP and RING lines are DC coupled. Bias current flows through resistor 70 producing a voltage approximately twice the threshold voltage at the LPF capacitor 82 output which produces the OFF HOOK status.

The spectrum shaping amplifier 32 provides any analog pre/de-emphasis which may be desirable for the transmit audio. It also sums the transmit analog signals from both the two-wire and four-wire inputs. The circuit is AC coupled, via capacitors 146 and 140 to, respectively, the interfaces 12 and 18 to remove the DC voltage resulting from the telephone bias currents. The gains of the two-wire and four-wire transmit paths can be set independently using resistor 148 and resistor 142 respectively. The nominal gain of the interfaces are 14.3 dB for the two-wire path in interface 12 and 3 dB for the four-wire path in interface 18. The gains are set so that the signal peaks between capacitor 153 and switch 34 reach approximately 3 volts when speaking at a normal level. The output of the spectrum shaping amplifier 152 is AC coupled through capacitor 153 to the AGC circuit 36 to prevent a DC offset voltage from causing unnecessary transitions in the AGC 36 output signal as the gain is changed.

Figure 6:
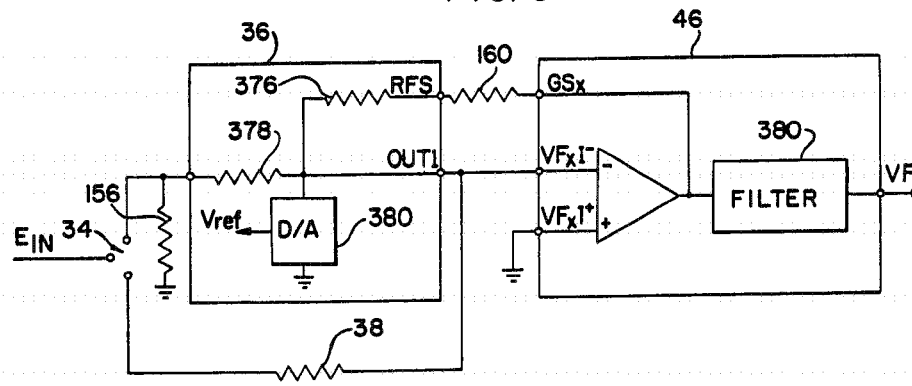
FIG. 6 shows a further detail of the automatic gain control circuit according to the present invention; and, FIG. 7 shows the timing of an analog-digital/digital-analog converter in accordance with the present invention.

The AGC circuit 36 and input filter 46 portion of the filter 44 are described together in further detail here, as shown in FIG. 6, because a ladder network contained in the AGC 36 circuit and an input operational amplifier 375 contained in the filter 44 are interconnected to form a composite gain block. The equivalent circuit for the AGC 36 and a portion of the input filter 46 circuit within the filter 44 is shown in FIG. 6.

Within the AGC circuit 36 is a feedback resistor 376 which, together with feedback resistor 160 acts as a negative feedback loop for operational amplifier 375. The AGC circuit 36 and the operational amplifier 375 also have an input resistor 378.

The gain of this AGC 36 and filter 44 circuit from $E_{IN}$ at switch 34 to $E_O$ at $VF_x$ at the output of the operational amplifier 375 in the filter circuit 44 $VF_x0$ is $$G = \frac{E_O}{E_{IN}} = -\frac{D}{256}\left(\frac{R_{160} + R_{376}}{R_{378}}\right)$$

where D is the digital code loaded into the AGC 36 ($0 \leq D \leq 255$) on pins PDI07-00 and resistors 376 and 378 are nominally 10 Kohms. A digital-to-analog converter 380 in the AGC 36 circuit is connected to a precision reference voltage $V_{ref}$ and provides a current output representative of the value D/256−1 where D is the digital input to the AGC 36 on PDI07-00 from the analyzer 41.

In operation the AGC 36 and input filter 46 circuits cover a gain range of 30 dB (+14 dB to −16 dB), in 2 dB steps, although the hardware is capable of greater range and finer resolution. Table 1 lists the values of D stored in the memory in the analyzer 41 corresponding to respective four-bit counts (0–15 decimal) from the AGC controller accumulator GCNT in the analyzer 41, along with the corresponding gains based on the component values used in the AGC 36 and the input filter 46 circuits.

The remainder of the input filter 46 integrated circuit actually performs the low pass filter function in filter 380 and introduces +3 dB gain in the passband. The input filter 46 output on pin 16 (VF$_x$0) of filter 44 is therefore 3 dB higher than the values shown in Table 1.

TABLE 1

| AGC/Filter Gain Settings | | |
|---|---|---|
| GCNT | D | Gain in dB |
| 0 | 255. | +13.8 |
| 1 | 203. | +11.7 |
| 2 | 162. | +9.8 |
| 3 | 129. | +7.8 |
| 4 | 102. | +5.8 |
| 5 | 81. | +3.1 |
| 6 | 64. | +1.75 |
| 7 | 51. | −.21 |
| 8 | 40. | −2.3 |
| 9 | 32. | −4.3 |
| 10 | 26. | −6.1 |
| 11 | 20. | −8.3 |
| 12 | 16. | −10.2 |
| 13 | 13. | −12.0 |
| 14 | 10. | −14.3 |
| 15 | 8. | −16.3 |

The AGC circuit 36 bypass strap 34 permits the AGC 36 to be bypassed for specific applications or for test purposes. When the strap 34 is in the bypass position, the gain from the strap to the input (transmit) filter 46 portion of filter 44 output VF$_x$0 is +3.36 dB, which is close to mid-range AGC 36 setting.

The A/D-D/A function is performed using the INTEL 29 11A A-Law CODEC 50. The CODEC 50 and an INTEL 2912 filter 44 form a functional block which is interconnected as is well known in the art.

A suitcase strap is provided on the VFRI input of the output (receive) filter 48 portion of the filter 44 at 56 to allow the audio input to be looped back to the output for test purposes.

Figure 7:
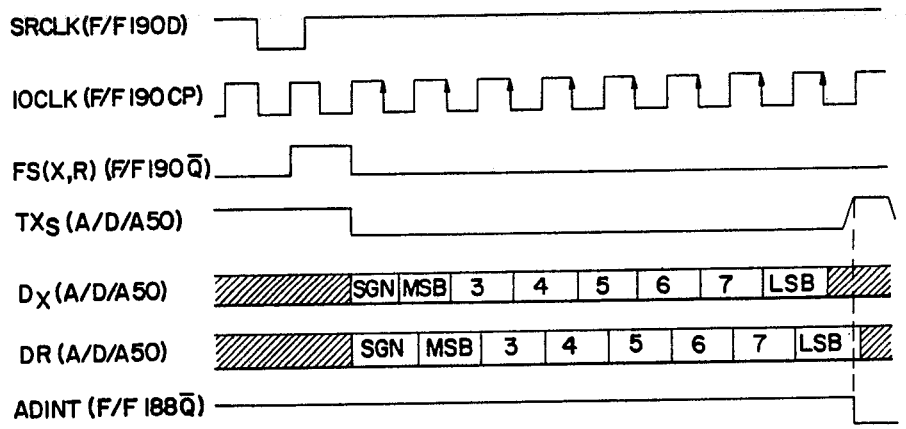

The serial output of the A/D converter 50 which is at 64,000 bps and represents the digitized voice is converted to 8 bit parallel word in serial-to-parallel converter 58. The TS$_x$ output of the CODEC 50 is used for several functions in the A/D-D/A operation. During its active time the TS$_x$ output enables the shift clocks on serial-to-parallel converter 58 and parallel-to-serial converter 60 so that the CODEC 50 can output its A/D word. It also enables inputing a new D/A word from the parallel-to-serial converter 60, which is the synthesized digital voice from the synthesizer 249 in the analyzer 41 at 64,000 bps. The trailing edge of TS$_x$ (data transfer is complete) is used to generate an interrupt request for the A/D and D/A portions of the A/D/A converter 50 (ADINT) in flip-flop 88. The actual A/D and D/A conversions are started when the FS(X,R) signal is generated for the CODEC A/D/A converter 50. FS signal is generated using retimed SRCLK from flip-flop 190 on pin $\overline{Q}$. The timing sequence for the CODEC 50 is shown in FIG. 7. When an ADINT pulse is generated, e.g., every eight bits in time the data (eight bits) in the serial-to-parallel converter 58 is loaded to the processor 41 and the data (eight bits) in the parallel-to-serial converter 60 is loaded to the A/D/A converter 50.

The Rx low pass filter output VFRO drives the inverting amplifier 204. The gain of this amplifier 204 is adjustable via variable resistor 198 to set the receive signal level. The output of amplifier 204 drives both the two-wire and four-wire audio output circuits, which drive the speaker in the telephone handset (not shown).

SUMMARY OF THE SCOPE AND ADVANTAGES OF THE INVENTION

It will be seen that the present invention in a broad sense provides for digital control of a digital-to-analog AGC circuit dependent upon the RMS measured during data compression of digitized voice talker end of the transmission line. The control of the AGC is for the purpose of maintaining an analyzer means which performs the data compression within a certain range of RMS values. The availability of the digital data representing the adjustment of the AGC enables inclusion in the compressed data of a gain data signal representative of the RMS measured in the analyzer during compression of the digitized voice data adjusted by the inverse of the change in the AGC in order to keep the analyzer within its RMS limits for proper operation. The gain data transmitted and utilized in the synthesizer portion of a remote analyzer at the listener end of the transmission link, during data expansion, is thus the true gain of the analog voice signal which was compressed in the analyzer at the talker end of the transmission link. In addition the present invention, in combination with the above, includes, in a more narrow sense, echo suppression at both the talker end and the receiver end, along with a hybrid operational amplifier echo suppression circuit, which particularly is suited for echo suppression in a transmission and receiver system employing compressed digitized voice data.

The foregoing description of the present invention has been directed to a particular embodiment of the invention in accordance with the requirements of the patent statutes and for purposes of illustrating and explaining the invention. It will be apparent, however, to those skilled in this art that many modifications and changes in both the method and apparatus of the present invention may be made without departing from the scope and spirit of the present invention. For example, other means of data compression which employ RMS may be used. Also the analyzer/synthesizer can be microprocessor implemented or implemented by, e.g., a minicomputer or by suitable hand-wired large-scale integrated circuitry dedicated to performance of the functions described herein. The particular values for the logic decisions described herein may be varied as desired from the preferred embodiment described herein. It will be further apparent that the invention may also be utilized, with suitable modifications within the state of the art which will be apparent to those skilled in the art. It is the applicants' intention in the following claims to cover all such equivalent modifications and variations as fall within the true scope and spirit of the invention.

What is claimed is:

1. An apparatus for use in the transmission of digital voice data, comprising a digital voice processor including:
    an analyzer means for compressing digitized voice data according to an algorithm including a measured root mean square of the digitized voice data being compressed;

an analog-to-digital conversion means for converting an analog voice signal to digitized voice data as an input to the analyzer means;

an automatic gain control means within the analog-to-digital conversion means for controlling the gain of the analog voice signal prior to the analog voice signal being digitized, such that the digitized voice data input to the analyzer means has a root mean square within selected limits, the setting of the automatic gain control means being responsive to the value of the root mean square of the digitized voice data, as measured by the analyzer means;

means for including in the digitized voice data, compressed for transmission, data representative of the root mean measured in the analyzer means, adjusted by the inverse of the change induced in the gain of the automatic gain control means in order to maintain the analyzer means root mean square within the selected limits;

the automatic gain control means including a gain setting means for setting the gain in a stepwise fashion, with each step constituting a change in the gain of a selected value from the previous gain setting, in response to a digital output gain signal;

an output gain signal selection means for selecting the digital output gain signal in response to the relation between the most recent peak root mean square measured by the analyzer and a selected ideal root mean square value plus or minus a selected range value; and, a voice synthesizer means receiving said output gain signal for generating a synthesized voice signal.

2. The apparatus of claim 1, further comprising:
the output gain signal selection means including a stored memory containing values representative of selected desired gain settings and the output gain signal selection means selecting the desired gain setting from the stored memory.

3. The apparatus of claim 1 further comprising:
the analyzer means including a means for determining the existence of voiced and unvoiced components of the digitized voice data to be compressed for transmission; and,
the automatic gain control means including a limiting means for limiting rapid gain changes and insuring gain changes are in response to changes in the voiced component of the digitized voice data, the limiting means including a means for detecting a voiced component or an unvoiced component in the digitized voice data, compressed for transmission, and assigning a posivite value to each occurrence of a voiced component, and a negative value to each occurrence of an unvoiced component, and for initiating a gain change in response to the cumulative sum of the positive and negative values, exceeding a selected value.

4. The apparatus of claim 3, further comprising:
the output gain signal selection means including a stored memory containing values representative of selected desired gain settings and the output gain signal selection means selecting the desired gain setting from the stored memory.

5. A sythesizer for simulating speech by producing an analog speech signal from digitized voice data, compressed for transmission by an analyzer means at a remote location, wherein the compressed digitized voice data is arranged in frames and includes data representative of pitch, gain, and a plurality of linear predictive algorithm envelope generation factors for each frame, comprising:

adjustable filtering means responsive to said envelope generation factors for generating the frequency domain envelope of the speech signal from the envelope generation factors according to a linear predictive algorithm;

a harmonic generating means for coupled to said adjustable filtering means for generating harmonics of the pitch having amplitudes as defined by the frequency domain envelope;

an amplifying means for amplifying the output of the harmonic generating means in response to the gain data representative of the actual gain of the voice signal, which gain data is representative of the root means square, detected in the analyzer at the remote location, adjusted by the inverse of the gain change induced in the analog voice signal, prior to compression at the remote location, in order to maintain the root mean square of the remote analyzer within selected limits; and an echo suppression means, responsive to said analyzer root mean square and responsive to a synthesizer root means square, for detecting which of the digitized voice signals in the analyzer or the sythesizer has a lesser root means square and for suppressing the gain of the one detected to have the lesser root mean square.

6. The apparatus of claim 5, further comprising:
a synthesizer gain suppressing means for detecting whether the most recent peak root mean square in the analyzer is greater than a first selected threshold and is greater than the root mean square in the synthesizer plus a selected loss compensation value, and for suppressing the gain in the synthesizer responsive to the detection of such a condition;

an analyzer gain suppressing means for detecting whether the most recent peak root mean square in the synthesizer is greater than the first selected threshold and is greater than the root mean square in the analyzer plus the selected loss compensation value, and for suppressing the gain in the analyzer responsive to the detection of such a condition; and
said synthesizer and analyzer suppressing means both responsive to said analyzer and synthesizer root mean squares.

7. The apparatus of claim 6, further comprising:
a near talker interrupt detection means for detecting whether the root mean square in the analyzer exceeds a second selected threshold and for removing the suppression of the analyzer gain in response to the existence of such a condition;
a far talker interrupt detection means for detecting whether the root mean square in the synthesizer exceeds the second selected threshold and for removing the suppression of the synthesizer gain in response to the existence of such a condition; and
said near and far talker interrupt detection means both responsive to said analyzer and synthesizer root mean squares.

8. An apparatus for use in the transmission of digital voice data, compressed for transmission, comprising:
an analyzer means for compressing digitized voice data according to an algorithm including a measured root mean square of the digitized voice data being compressed;

an analog-to-digital conversion means for converting an analog voice signal to digitized voice data as an input to the analyzer means;

an automatic gain control means within the analog-to-digital conversion means for controlling the gain of the analog voice signal prior to the analog voice signal being digitized, such that the digitized voice data input to the analyzer means has a root mean square within selected limits, the setting of the automatic gain control means being responsive to the value of the root mean square of the digitized voice data, as measured by the analyzer means;

means for including in the digitized voice data, compressed for transmission, data representative of the root mean square measured in the analyzer means, adjusted by the inverse of the change induced in the gain of the automatic gain control means in order to maintain the analyzer means root mean square within the selected limits;

the automatic gain control means including a gain setting means for setting the gain in a stepwise fashion, with each step constituting a change in the gain of a selected value from the previous gain setting, in response to a digital output gain signal; and, an output gain signal selection means for selecting the digital output gain signal in response to the relation between the most recent peak root mean square measured by the analyzer and a selected ideal root mean square value plus or minus a selected range value.

9. The apparatus of claim 8, further comprising:

the output gain signal selection means including a stored memory containing values representative of selected desired gain settings and the output gain signal selection means selects the desired gain setting from the stored memory.

10. The apparatus of claim 8, further comprising:

the analyzer means including a means for determining the existence of voiced and unvoiced components of the digitized voice data to be compressed for transmission; and, the automatic gain control means including a limiting means for limiting rapid gain changes and insuring gain changes are in response to changes in the voiced component of the digitized voice data, the limiting means including a means for detecting a voiced component or an unvoiced component in the digitized voice data, compressed for transmission, and assigning a positive value to each occurrence of a voiced component, and a negative value to each occurrence of an unvoiced component, and for initiating a gain change in response to the cumulative sum of the positive and negative values, exceeding a selected value.

11. The apparatus of claim 10, further comprising:

the output gain signal selection means including a stored memory containing values representative of selected desired gain settings and the output gain signal selection means selecting the desired gain setting from the stored memory.

12. An apparatus for use in the transmission of digital voice data, compressed for transmission, comprising:

an analyzer means for compressing digitized voice data according to an algorithm including a measured root mean square of the digitized voice data being compressed;

an analog-to-digital conversion means for converting an analog voice signal to digitized voice data as an input to the analyzer means;

an automatic gain control means within the analog-to-digital conversion means for controlling the gain of the analog voice signal prior to the analog voice signal being digitized, such that the digitized voice data input to the analyzer means has a root mean square within selected limits, the setting of the automatic gain control means being responsive to the value of the root mean square of the digitized voice data, as measured by the analyzer means;

means for including in the digitized voice data, compressed for transmission, data representative of the root mean square measured in the analyzer means, adjusted by the inverse of the change induced in the gain of the automatic gain control means in order to maintain the analyzer means root mean square within the selected limits;

the analyzer means including a means for determining the existence of voiced and unvoiced components of the digitized voice data to be compressed for transmission; and, the automatic gain control means including a limiting means for limiting rapid gain changes and insuring gain changes are in response to changes in the voiced component of the digitized voice data, the limiting means including a means for detecting a voiced component or an unvoiced component in the digitized voice data, compressed for transmission, and assigning a positive value to each occurrence of a voiced component, and a negative value to each occurrence of an unvoiced component, and for initiating a gain change in response to the cumulative sum of the positive and negative values, exceeding a selected value.

13. The apparatus of claim 12, further comprising:

the output gain signal selection means including a stored memory containing values representative of selected desired gain settings and the output gain signal selection means selecting the desired gain setting from the stored memory.

14. An apparatus for use in the transmission of digital voice data, compressed for transmission, comprising:

an analyzer means for compressing digitized voice data according to an algorithm including a measured root mean square of the digitized voice data being compressed;

an analog-to-digital conversion means for converting an analog voice signal to digitized voice data as an input to the analyzer means;

an automatic gain control means within the analog-to-digital conversion means for controlling the gain of the analog voice signal prior to the analog voice signal being digitized, such that the digitized voice data input to the analyzer means has a root mean square within selected limits, the setting of the automatic gain control means being responsive to the value of the root mean square of the digitized voice data, as measured by the analyzer means;

means for including in the digitized voice data, compressed for transmission, data representative of the root mean square measured in the analyzer means, adjusted by the inverse of the change induced in the gain of the automatic gain control means in order to maintain the analyzer means root mean square within the selected limits; and a synthesizer means for synthesizing expanded digitized voice data, received from a remote location as compressed digitized voice data, to form an analog speech signal.

15. The apparatus of claim 14, further comprising:

an echo suppression means responsive to the root mean squares from said synthesizer and said analyzer for detecting which of the digitized voice signals in the analyzer of the synthesizer has a lesser root mean square and for suppressing the gain of the one detected to have the lesser root mean square.

16. The apparatus of claim 15, further comprising:

a synthesizer gain suppressing means for detecting whether the most recent peak root mean square in the analyzer is greater than a first selected threshold and is greater than the root mean square in the synthesizer plus a selected loss compensation value, and for suppressing the gain in the synthesizer responsive to the detection of such a condition;

an analyzer gain suppressing means for detecting whether the most recent peak root mean square in the synthesizer is greater than the first selected threshold and is greater than the root mean square in the analyzer plus the selected loss compensation value, and for suppressing the gain in the analyzer responsive to the detection of such a condition; and said synthesizer and analyzer suppressing means both responsive to said analyzer and synthesizer root mean squares.

17. The apparatus of claim 16, further comprising:

a near talker interrupt detection means for detecting whether the root mean square in the analyzer exceeds a second selected threshold and for removing the suppression of the analyzer gain in response to the existence of such a condition;

a far talker interrupt detection means for detecting whether the root mean square in the synthesizer exceeds the second selected threshold and for removing the suppression of the synthesizer gain in response to the existence of such a condition; and said near and far talker interrupt detection means both responsive to said analyzer and synthesizer root mean squares.

18. An apparatus for use in the transmission of digital voice data, compressed for transmission, comprising:

an analyzer means for compressing digitized voice data according to an algorithm including a measured root mean square of the digitized voice data being compressed;

an analog-to-digital conversion means for converting an analog voice signal to digitized voice data as an input to the analyzer means;

an automatic gain control means within the analog-to-digital conversion means for controlling the gain of the analog voice signal prior to the analog voice signal being digitized, such that the digitized voice data input to the analyzer means has a root means square within selected limits, the setting of the automatic gain control means being responsive to the value of the root mean square of the digitized voice data, as measured by the analyzer means;

means for including in the digitized voice data, compressed for transmission, data representative of the root mean square measured in the analyzer means, adjusted by the inverse of the change induced in the gain of the automatic gain control means in order to maintain the analyzer means root mean square within the selected limits;

a synthesizer means for synthesizing expanded digitized voice data, received from a remote location as compressed digitized voice data, to form an analog speech signal;

a synthesizer gain suppressing means, responsive to said synthesizer and analyzer root mean squares, for detecting whether the most recent peak root mean square in the analyzer is greater than a first selected threshold and is greater than the root mean square in the synthesizer plus a selected loss compensation value, and for suppressing the gain in the synthesizer responsive to the detection of such a condition; and an analyzer gain suppressing means, responsive to said synthesizer and analyzer root mean squares, for detecting whether the most recent peak root mean square in the synthesizer is greater than the first selected threshold and is greater than the root mean square in the analyzer plus the selected loss compensation value, and for suppressing the gain in the analyzer responsive to the detection of such a condition.

19. The apparatus of claim 18, further comprising:

a near talker interrupt detection means for detecting whether the root mean square in the analyzer exceeds a second selected threshold and for removing the suppression of the analyzer gain in resppnse to the existence of such a condition;

a far talker interrupt detection means for detecting whether the root mean square in the synthesizer exceeds the second selected threshold and for removing the suppression of the synthesizer gain in response to the existence of such a condition; and said near and far talker interrupt detection means both responsive to said analyzer and synthesizer root mean squares.

20. A method of compressing a digitized voice signal for transmission, comprising:

converting an analog voice signal to an expanded digitized voice signal;

compressing the digitized voice signal in an analyzer means for digitized voice compression according to an algorithm including a measured root mean square of the digitized voice signal;

dhanging the gain of the expanded digitized voice signal, as necessary, in order to maintain the root mean square within selected limits;

including in the digitized voice data compressed for transmission data representing the measured root mean square adjusted by the inverse of change in the gain of the expanded digitized voice data induced to maintain the root mean square within the selected limits; and the changing step including detecting the voiced and unvoiced components of the digitized voice signal and assigning a positive value to the voiced components and a negative value to the unvoiced components and initiating a gain change in response to the sum of the positive and negative values exceeding a selected value and in response to the most recent peak root mean square differing from a selected ideal root mean square by a selected range value.

* * * * *